(12) United States Patent
Drobny et al.

(10) Patent No.: US 6,576,535 B2
(45) Date of Patent: Jun. 10, 2003

(54) CARBON DOPED EPITAXIAL LAYER FOR HIGH SPEED CB-CMOS

(75) Inventors: Vladimir F. Drobny, Tucson, AZ (US); Dennis D. Liu, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/829,897

(22) Filed: Apr. 11, 2001

(65) Prior Publication Data

US 2002/0151153 A1 Oct. 17, 2002

(51) Int. Cl.[7] .......................... H01L 20/20; H01L 21/36
(52) U.S. Cl. ...................... 438/507; 438/503; 438/203; 438/322; 438/481; 438/542
(58) Field of Search ................................ 438/203, 322, 438/323, 478, 479, 481, 503, 507, 510, 542, 543, 565, 607; 257/574, 591, 592; 117/105

(56) References Cited

U.S. PATENT DOCUMENTS

| | | | | |
|---|---|---|---|---|
| 4,891,332 A | | 1/1990 | Bloem et al. ................ | 438/384 |
| 4,968,384 A | | 11/1990 | Asano ........................... | 438/96 |
| 5,189,504 A | | 2/1993 | Nakayama et al. .......... | 257/422 |
| 5,441,901 A | * | 8/1995 | Candelaria ................... | 438/317 |
| 5,525,540 A | | 6/1996 | Zenke et al. ................. | 438/482 |
| 5,940,725 A | | 8/1999 | Hunter et al. ................ | 438/592 |
| 6,030,874 A | | 2/2000 | Grider et al. ................ | 438/301 |
| 6,043,139 A | * | 3/2000 | Eaglesham et al. .......... | 438/495 |
| 6,080,644 A | | 6/2000 | Drobny et al. ............... | 438/507 |

FOREIGN PATENT DOCUMENTS

JP  02000077425 A  9/1998 ................. 21/331

OTHER PUBLICATIONS

Kanzawa et al. (JP 2000–077425) (Mar. 14, 2000) (Translation).*
L.D. Lanzerotti et al. "Si/Si1–x–yGexCy/Si Heterojunction Bipolar Transistors", 1996 IEEE, pp. 334–337.*
H.J. Osten et al. "Carbon Doped SiGe Heterojunction Bipolar transistors for High Frequency Applications", 1999, IEEE, pp. 109–116.*
H.J. Osten et al. "Carbon Doping of SiGe Heterobipolar Transistors", 1998, IEEE, pp. 19–23.*
"The Effect of Carbon Incorporation on SiGe Heterobipolar Transistor Performance and Process Margin" by Osten et al., IEEE 1997, 4 pages.
"Suppression of Boron Outdiffusion in SiGe HBTs by Carbon Incorporation" by Lanzerotti et al., IEEE 1996, 4 pages.

* cited by examiner

Primary Examiner—Amir Zarabian
Assistant Examiner—Maria Guerrero
(74) Attorney, Agent, or Firm—W. Daniel Swayze, Jr.; W. James Brady; Frederick J. Telecky, Jr.

(57) ABSTRACT

A method for fabricating a high speed complementary bipolar/CMOS device is disclosed which enables the forming of a silicon epitaxial layer in a PNP transistor having carbon incorporated therein to suppress boron up-diffusion from lower heavily boron-doped buried layers into upper PNP structures. According to an embodiment of the invention, an epitaxial layer is formed on a P type silicon substrate in which a plurality of P+ buried layer regions, a plurality of N+ buried layer regions, and a P+ field layer region occupying most of the substrate surface are diffused. The substrate is loaded in a reactor with a carrier gas and pre-baked at a temperature of approximately 850° C. for a time. The temperature is then increased to approximately 1050° C. and subjected to a high temperature bake cycle. A thin carbon-doped epitaxial cap layer is deposited on the substrate, which then is subjected to a high temperature gas purge cycle at approximately 1080° C. Then an N− epitaxial layer is deposited on the carbon-doped epitaxial cap layer at 1080° C. Use of a carbon-doped epitaxial cap layer significantly impedes boron up-diffusion from the lower buried layers into the upper PNP structures.

20 Claims, 4 Drawing Sheets

CARBON DOPED EPITAXIAL LAYER FOR HIGH SPEED CB-CMOS

BACKGROUND OF THE INVENTION

1. Field of the Invention

The invention relates generally to a high speed complementary bipolar/CMOS fabrication process, and more specifically to forming a silicon epitaxial layer in a PNP transistor having carbon incorporated therein to impede boron up-diffusion from lower heavily boron-doped buried layers into upper PNP structures.

2. State of the Art

Those skilled in the art know that it is difficult to provide a process for fabricating an epitaxial silicon layer that is satisfactory for use in a high speed complementary bipolar/CMOS process ("CB-CMOS"). In such a process, a very thin, lightly doped N-type epitaxial silicon layer must be grown on a silicon wafer including a P⁻type substrate having pre-formed P⁺ boron-doped buried layers and pre-formed N⁺ arsenic-doped buried layers. In a conventional CB-CMOS process, the epitaxial silicon layer is doped lightly in-situ with arsenic to a concentration of approximately $2 \times 10^{15}$ cm$^{-1}$ to achieve an optimal combination of characteristics for NPN, PNP and CMOS transistors to be formed. After the epitaxial deposition, the collector regions of the PNP and NPN transistors and the CMOS "wells" are further doped by a combination of low energy and high energy boron or phosphorous implants with energies and doses tailored to the needs of various "families" of devices. During conventional epitaxial growth and subsequent conventional thermal processing, dopant ions from both the P-type buried layers and the N-type buried layers previously formed in the substrate, such as boron and arsenic respectively, up-diffuse into corresponding portions of the epitaxial layer. This updiffusion is undesirable because it reduces the useful portions of the collector regions of the transistors, thereby reducing the cutoff frequencies and transistor switching speeds, and increasing the collector-to-emitter saturation voltage and power dissipation.

Conventionally, in "complementary" bipolar CMOS structures, it is desirable to have NPN and PNP transistors which have matched characteristics. One problem experienced in matching the characteristics of the NPN and PNP transistors, however, is that the P⁺ and N⁺ buried layers of the respective NPN and PNP transistors up-diffuse at significantly different rates, resulting in mismatches. Since the up-diffusion of a P⁺ buried layer accelerates more rapidly than an N⁺ layer with respect to temperature, differences in the thicknesses of the collectors of the PNP transistors and the NPN transistors are conventionally minimized by keeping the "Dt" of all high temperature process steps as low as possible. "Dt" is a term referring to the cumulative amount of time and heat that the wafer is subjected to high temperatures, usually exceeding 1000° C., after the epitaxial layer has been deposited. The deep double implants used to form the collectors of the required depth for the NPN and PNP transistors, respectively, eliminate the need for high Dt diffusions after the formation of the epitaxial layer. One drawback associated with the large differential dopant diffusivity of arsenic buried layers and boron buried layers, however, remains even for "low Dt processing." For very low Dt processes, achieving the desirable PNP collector often results in producing an undesirable lightly doped N type subregion where an NPN collector region meets the N⁺ buried layer.

A conventional approach to addressing boron up-diffusion in CB-CMOS structures involves one or more of the following processes: 1) creating a much thicker epitaxial layer than otherwise would be necessary for meeting the NPN breakdown requirements; 2) significantly reducing the doping levels for P⁺ buried layers compared as compared to the doping levels for N⁺ buried layers; 3) including a phosphorus, rather than arsenic, doped N⁺ buried layer; and 4) offering lateral PNP structures instead of vertical PNP structures. However, each of these processes improves the required breakdown characteristics of the PNP structures at the expense of the NPN or PNP device characteristics. An excessively thick epitaxial layer leads to a higher collector resistance of both NPN and PNP transistors. A thicker epitaxial layer also forces the use of a higher Dt in subsequent processing, which produces larger lateral device dimensions and larger junction capacitances. The light doping level of boron in the P⁺ buried layer adds to its already large resistance caused by the combination of low carrier concentration and low mobility of holes. In summary, NPN and PNP structures made using conventional approaches still are not well matched. They result in slowed operating responses and much larger area than necessary or desirable.

Carbon has been incorporated into SiGe epitaxial layers to suppress out diffusion of boron from the bases of rf bipolar transistor, as described in "Suppression of Boron Outdiffusion in SiGe HBT by Carbon Incorporation", by L. D. Lanzerotti et al., IDEM Technical Digest, pp. 249–252, 1986 and in "the Effect of Carbon Incorporation on SiGe Heterobipolar Transistor Performance and Process Margin", IDEM Technical Digest, pp. 80–86, 1987.

SUMMARY OF THE INVENTION

It is an object of the invention to provide a method of making a CB-CMOS device in which boron up-diffusion from a buried layer into an epitaxial layer of the CB-CMOS device is suppressed.

It is another object of the invention to provide a layer within the CB-CMOS device which includes sufficient carbon to significantly suppress boron up-diffusion.

It is yet another object of the invention to provide a CMOS structure which includes a carbon-doped epitaxial layer between buried layers and other epitaxial layers to suppress boron up-diffusion from the buried layers into the other epitaxial layers.

It is still yet another object of the invention to provide an improved epitaxial process for a CB-CMOS to suppress the up-diffusivity of boron without sacrificing speed or size characteristics.

It is still another object of the invention to provide a method of fabricating a high speed CB-CMOS device which includes at least two carbon-doped epitaxial layers, one between the buried layers and the epitaxial layers, and one on the final epitaxial layer to reduce dopant diffusivities within a transistor body between base and emitter.

The present invention provides a method for fabricating a high speed CB-CMOS device by incorporating a carbon-doped epitaxial layer to suppress boron up-diffusion from lower heavily boron-doped buried layers into upper structures. According to an embodiment of the invention, an epitaxial layer is formed on a P type silicon substrate in which a plurality of P⁺ buried layer regions, a plurality of N⁺ buried layer regions, and a P⁺ field layer region occupying most of the substrate surface are diffused. The substrate wafer is loaded in a reactor with a carrier gas and pre-baked at a temperature of approximately 850° C. The temperature is then gradually increased to approximately 1050° C. and subjected to a high temperature bake cycle. A thin carbon-doped epitaxial cap layer is deposited on the substrate, which then is subjected to a high temperature gas purge cycle at approximately 1080° C. Then an N⁻ epitaxial layer is deposited on the carbon-doped epitaxial cap layer at approximately 1080° C.

According to a second embodiment of the invention, the process further includes the steps of low temperature baking the wafers and increasing the temperature to approximately 1050° C., both in the presence of N⁺ gas. The process also further includes, between the steps of the high temperature gas purge cycle and deposition of the N⁻ epitaxial layer, depositing an intrinsic epitaxial layer on the carbon-doped epitaxial cap and performing an additional high temperature gas purge cycle, both at approximately 1080° C. The addition of these process steps increases the ability of the structure to suppress boron auto-doping during the epitaxial layer deposition processes and subsequent heating processes.

According to a third embodiment of the invention, the process of the first or second embodiments further includes a final, thin epitaxial layer grown on the thick epitaxial layer in the presence of carbon gas to form a second carbon doped epitaxial layer. Addition of this final carbon doped epitaxial layer allows for better matching of the emitter/base junctions of high speed bipolar transistors.

BRIEF DESCRIPTION OF THE DRAWINGS

The nature of the present invention as well as other embodiments of the present invention may be more clearly understood by reference to the following detailed description of the invention, to the appended claims, and to the drawings herein, wherein:

DETAILED DESCRIPTION OF THE PREFERRED EMBODIMENTS

In accordance with the present invention, an epitaxial process is performed on a P-substrate having heavily boron doped P⁺ buried layer regions and heavily arsenic doped buried layer regions. The epitaxial process is performed in the presence of carbon source gas to create a thin carbon doped silicon epitaxial layer. Thereafter, at least a first lightly doped N type epitaxial layer is grown on the carbon doped epitaxial layer, so that vertical NPN transistors and vertical PNP transistors can be formed in the lightly doped N type epitaxial layer. The carbon doped epitaxial layer reduces or suppresses the boron up-diffusion from a heavily boron-doped buried layers into structures in the epitaxial layers. The carbon dopant also reduces the already slow up-diffusion rate of the arsenic species supplied by the N⁺ buried layers into the structures in the epitaxial layers. As a result, the N⁺ and P⁺ buried layers both up-diffuse very slowly into the after-grown first epitaxial layer, with a much smaller differential diffusion rate between the two species. The slow up-diffusion rates and the small differential up-diffusion rates allow for better matching of the NPN and PNP transistor characteristics. Reduction of the differential diffusion rate between the two species also lowers the Dt required for subsequent processing. With the use of thin epitaxial layers and low Dt subsequent processing, much smaller vertical and lateral device dimensions can be achieved. The smaller vertical and lateral device dimensions offer higher speeds and lower die costs.

Silicon is a crystalline element forming a uniform lattice structure. Impurities found within a silicon structure, such as boron, arsenic, phosphorus, and antimony, all have intrinsic diffusivity which allows them to diffuse from a higher concentration silicon layer (i.e. doped layer) to a lower concentration silicon layer (i.e. undoped layer) through the lattice. The amount of intrinsic diffusivity of an impurity is greatly controlled or affected by point defects, or inconsistencies in the lattice structure such as vacancies and interstitials in the lattice structure. Most commonly, intrinsic diffusivity is enhanced by factors relating to the oxidation of the silicon, called oxidation enhanced diffusion (OED), and the implant process, called transient enhanced diffusion (TED). Doping an epitaxial layer with a small carbon atom suppresses the OED and TED effects through reduction of interstitial concentration. This results in a reduction of interstitial enhanced diffusion of impurities in the silicon layer. In other words, the carbon doping of a silicon layer reduces the enhancement of the intrinsic diffusivity of impurities.

Figure 1:
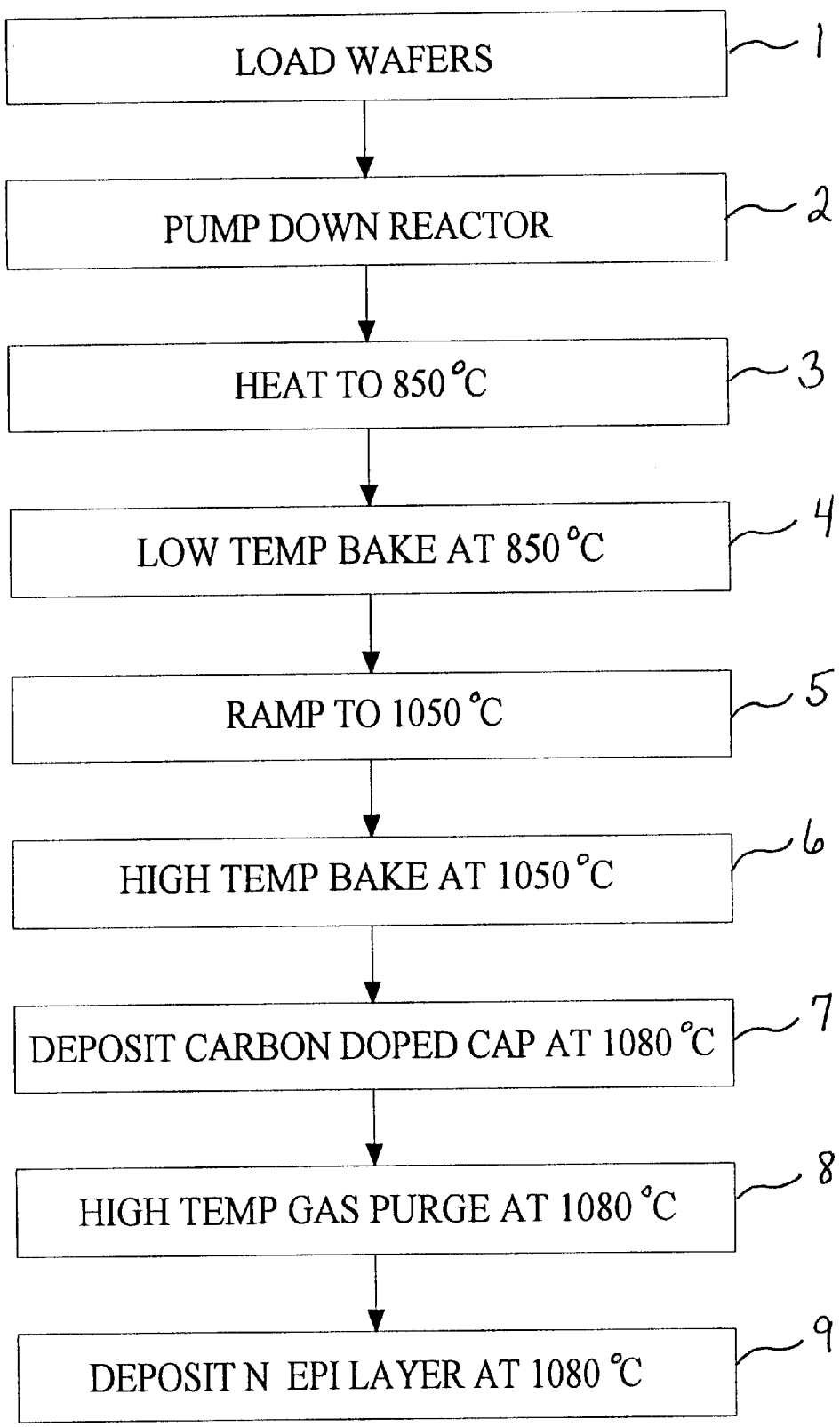
FIG. 1 is a flow chart useful in describing the process of a first embodiment of the present invention.

The process flow chart of FIG. 1 illustrates a simple embodiment of the present invention. In FIG. 1, blocks 1–6 of the illustrated process refer to conventional initial steps for growth of a lightly doped N type epitaxial silicon layer on a lightly doped P type silicon substrate. The low temperature bake step of block 4 is performed at approximately 850° C. for roughly 10 minutes, including ramp-up. Steps 3 and 4 are performed in the presence of hydrogen gas. Steps 5–9 of FIG. 1 are performed at high temperatures in the presence of hydrogen which is used as a carrier gas. High temperatures may vary by process but conventionally range between about 1000° C. to about 1150° C. Block 7 of the process illustrated in FIG. 1 refers to the novel step for growth of a carbon doped epitaxial cap layer on the wafer at approximately 1080° C.

Figure 2:
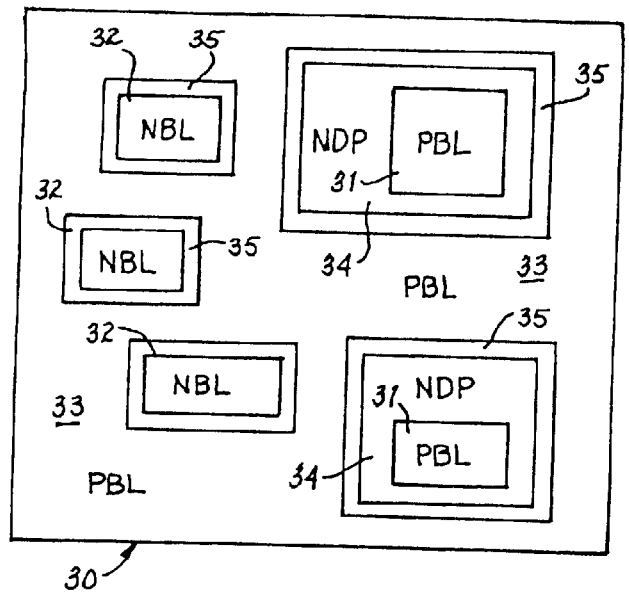
FIG. 2 is a plan view of a wafer showing locations of P⁺ and is N⁺ buried layer regions and the deep N⁺ regions.

Referring to FIGS. 1 and 2, note that the wafers referred to in process block 1 include the numerous P⁺ buried layers 31 in which the collectors of PNP transistors are formed, N⁺ buried layers 32 of NPN transistors are formed, and the "field" P⁺ region 33 such that a large portion (e.g., approximately 80%) of the surface area of each wafer contains a heavy concentration of P⁺ (boron) dopant atoms. FIG. 2 shows a single chip 30 of one of the silicon wafers. A number of P⁺ buried layers 31 and N⁺ buried layers 32 are formed in the P⁻ substrate, as shown. An N⁺ "ring" 32 around each N⁻ well 34 and P⁺ buried layer 31 therein as it appears in FIG. 2 is formed by a "deep N⁺" regions 34 in which the P⁺ buried layer is found. Each of the N type layers 32 and 34 is surrounded by a "ring" 35 of P⁻ substrate material between that layer and the P⁺ layer 33.

Figure 3:
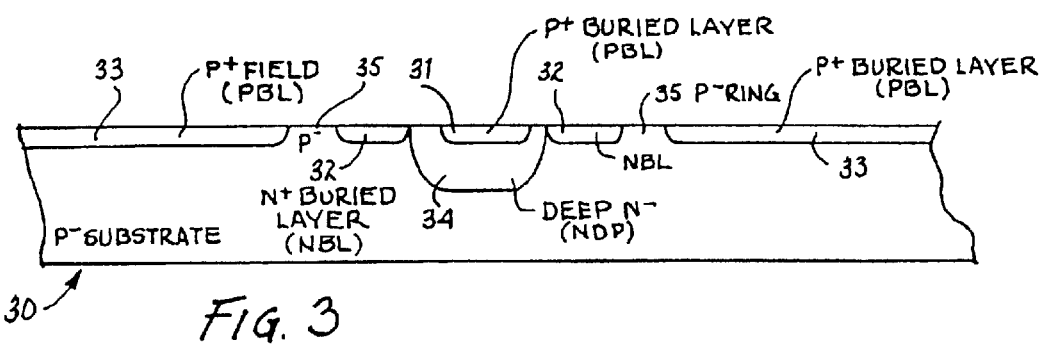
FIG. 3 is a partial section view of a wafer illustrating the structure of a chip fabricated using a CB-CMOS process compatible with the present invention.

FIG. 3 shows a cross sectional area of a portion of the wafer 30 before the beginning of the process illustrated in FIG. 1. Deep N⁺ regions 34 and P⁻ rings 35 separate and electrically isolate each P⁺ buried layer 31 from the rest of the P⁺ layer 33 of chip 30, which includes diffused P⁺ material identical to that of the P⁺ buried layers 31.

As indicated in process block 7 of FIG. 1, a very thin 200 Å to 2000 Å thick layer or "cap" layer 36 of carbon doped, epitaxial silicon (see FIG. 4) is deposited over the entire surface of the wafer 30 to form a "seal" or cap over the large portion of the wafer which has P⁺ "field" diffusion and P⁺ buried layers therein. This carbon-doped "cap" layer 36 suppresses up-diffusion of boron, arsenic and other related species such as phosphorous, from the buried layers to the later deposited N type epitaxial layer 38 (see FIG. 4).

One method for depositing the silicon carbon doped layer is to use methylsilane ($CH_3SiH$) as the carbon source, supplied as 20% to 50% hydrogen diluted methylsilane into the deposition chamber. The methylsilane is introduced into the system at a flow rate between approximately 10 ccm to 180 ccm for between 5 and 15 seconds depending on the desired dopant concentration and thickness of the layer. The target carbon concentration is approximately $5 \times 10^{19}$ to $9 \times 10^{20}$. Selected variations in the flow rate of methylsilane and the deposition time at varying temperatures will allow the process to generate layers sufficient to meet the requirements of varying devices. For example, at a deposition temperature of 1050° C., the target concentration may be reached using a 20% hydrogen diluted methylsilane mixture at a flow rate of 50 ccm for approximately 10 seconds. Because the carbon concentration does not affect the electrical characteristics of the device other than the enhancement of the breakdown voltage, an exact concentration is not required. The carbon concentration (which is related to the methylsilane flow rate) and the layer thickness (which is related to the deposition time) should be varied to optimize the position of the carbon doping to minimize the TED and the OED according to the Dt requirement of the process flow. It is believed that one of ordinary skill in the art may readily adapt the explanation provided herein to any desired fabrication process to achieve an optimal thickness and carbon dopant concentration in an epitaxial layer for that process.

Figure 4:
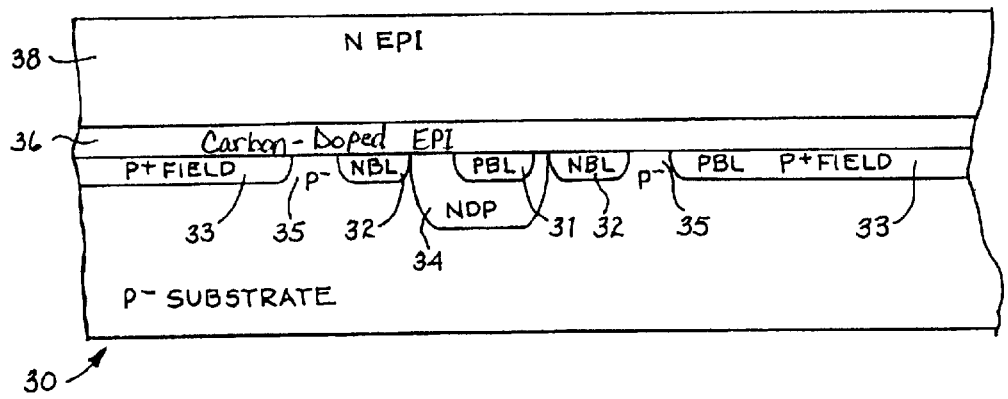
FIG. 4 is a partial section view of the wafer shown in FIG. 3 after deposition of the a carbon-doped epi layer and a lightly doped N type epi layer in accordance with an embodiment of the invention.

Process block 8 refers to a high temperature gas purge at 1080° C. for approximately 5–10 minutes, depending on the ratio of P⁺ field area 33 to the total wafer area to cause redistribution of the dopant molecules in the P⁺ field diffusion area to the "non-P⁺" area. After the high temperature gas purge of process block 8, a conventional 0.9 micron epitaxial deposition of silicon layer 38, shown in FIG. 4, is formed on the top of the carbon-doped cap 36 at 1080° C., as indicated in process block 9. Depending on the voltage level required for a given application, the final silicon epitaxial layer thickness may vary between 0.3 microns for a low voltage application to 5 microns for a high voltage application (i.e. 50 V).

Figure 5:
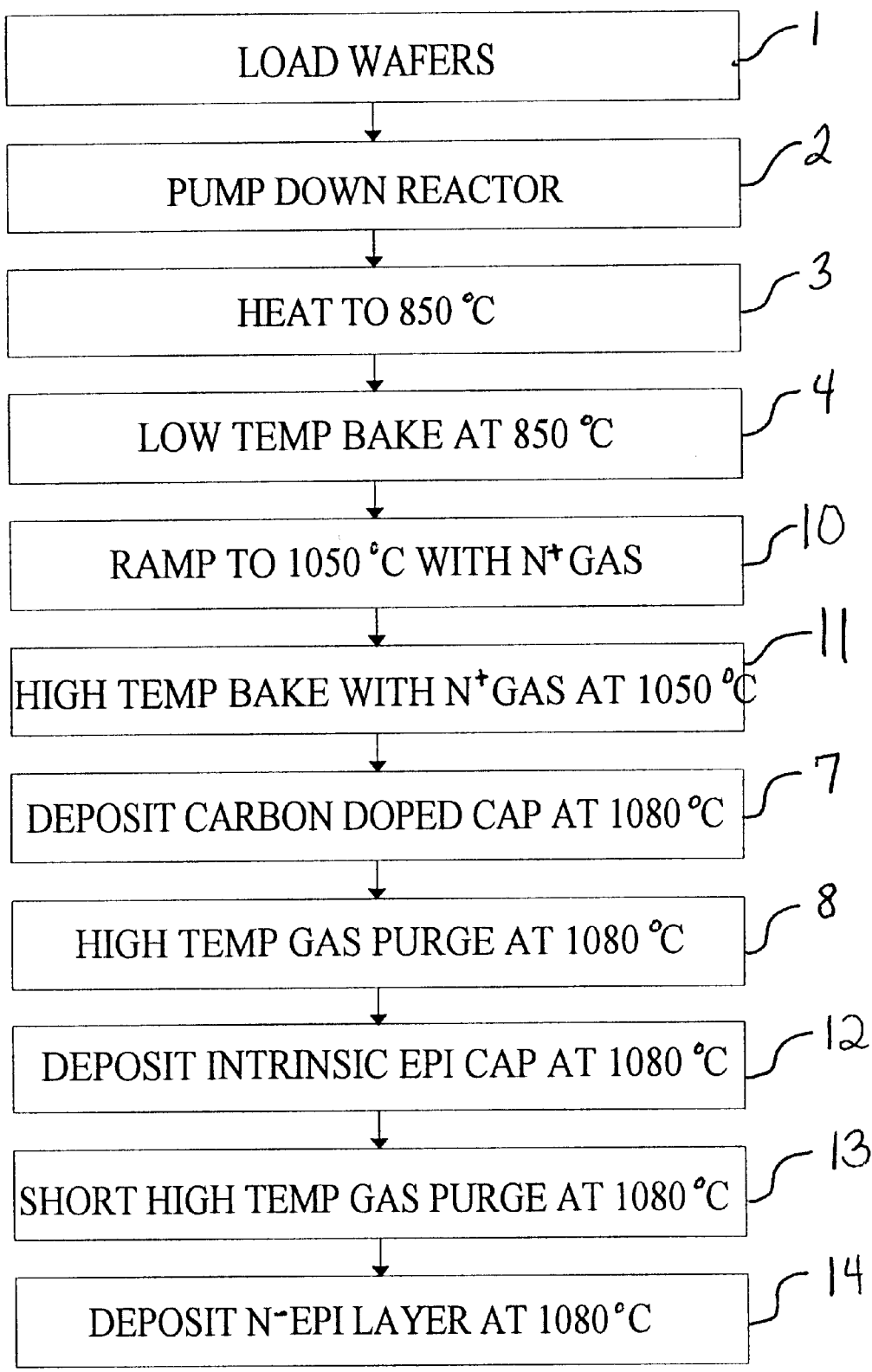
FIG. 5 is a flow chart useful in describing the process of a second embodiment of the present invention.
Figure 6:
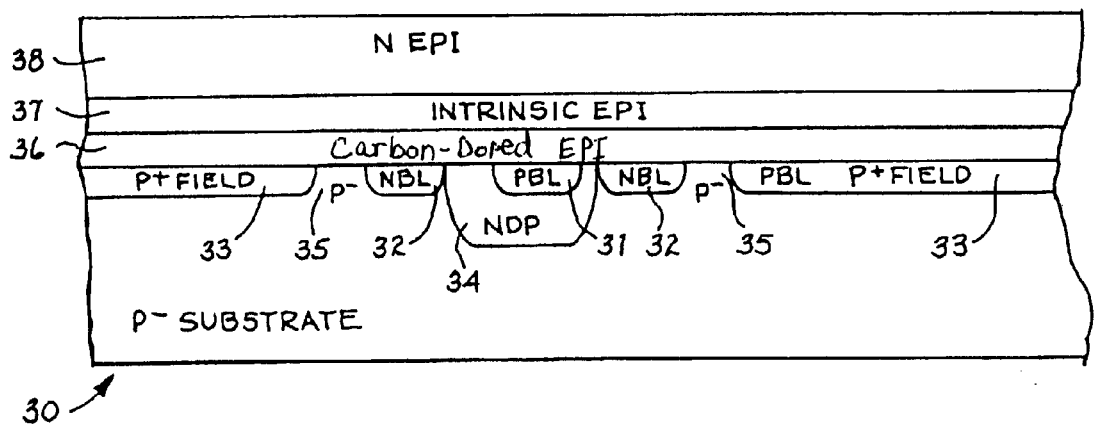
FIG. 6 is a partial section view of the wafer shown in FIG. 5 after deposition of the a carbon-doped epi layer, an intrinsic epi layer and a lightly doped N type epi layer in accordance with an embodiment of the invention.

One particular advantage of the present invention is that it is compatible with and may be integrated into more complex epitaxial layer fabrication processes. By integrating the carbon-doped epitaxial layer of the present invention into other complex epitaxial processes, the advantages of boron up-diffusion suppression may be enjoyed in addition to the advantages of other processes. For example, as illustrated by FIGS. 5 and 6, the carbon-doped epitaxial layer may be incorporated into the epitaxial layers described in U.S. Pat. No. 6,080,644 entitled "Complementary Bipolar/CMOS Epitaxial Structure and Process" issued Jun. 27, 2000, the disclosure of which is hereby incorporated herein by reference. Drobny et al. disclose a method of reducing boron auto-doping throughout the conventional high temperature gas purge and upper epitaxial layer deposition steps by performing reactor temperature ramp-up and high temperature bake cycles in the presence of N+ dopant gas in the hydrogen carrier gas, and also by the formation of at least one intrinsic epitaxial cap at a temperature of about 1080° C.

FIG. 5 represents a process, such as that shown in FIG. 3 of the Drobny et al. patent, which has been modified by the processes described in reference to the present invention. As shown in FIG. 5, process block 7 of the Drobny et al. patent, the step of depositing an intrinsic 0.3 micron epitaxial cap at 1080° C., was replaced by the step of depositing a carbon-doped 200 Å to 2000 Å cap at 1080° C. in the present invention. As explained in the Drobny et al. disclosure, by depositing the epitaxial cap over the buried layers of the structure, auto-doping is significantly reduced. The auto-doping suppression properties of the invention described in the Drobny et al. disclosure are not diminished by using a carbon doped epitaxial cap according to the present invention.

As with the process shown in FIG. 1, the process represented by the diagram in FIG. 5, process blocks 1–4, includes loading the wafers, pumping down the reactor, heating the reactor to 850° C. and baking the wafers at 850° C. In accordance with the disclosure of Drobny et al., as represented by process blocks 10 and 11, the temperature ramp cycle and high temperature baking cycle are done in the presence of N⁺ gas at 1050° C. As explained in the disclosure of Drobny et al., the presence of N+ gas during the temperature ramp cycle and the high temperature baking cycle compensates for (or "counterdopes") the boron autodoping and corrects the NPN collector profile. Most of the autodoping occurs before any of the carbon doped epitaxial cap is grown. Thereafter, distinct from the Drobny et al. disclosure, the process of the present invention, as represented by process block 7, deposits a carbon doped epitaxial cap at 1080° C. as explained in reference to FIG. 1. As represented by process blocks 8 and 12–14, the high temperature gas purge, intrinsic epitaxial cap, high temperature gas purge and final epitaxial layer steps are all performed at 1080° C.

Figure 7:
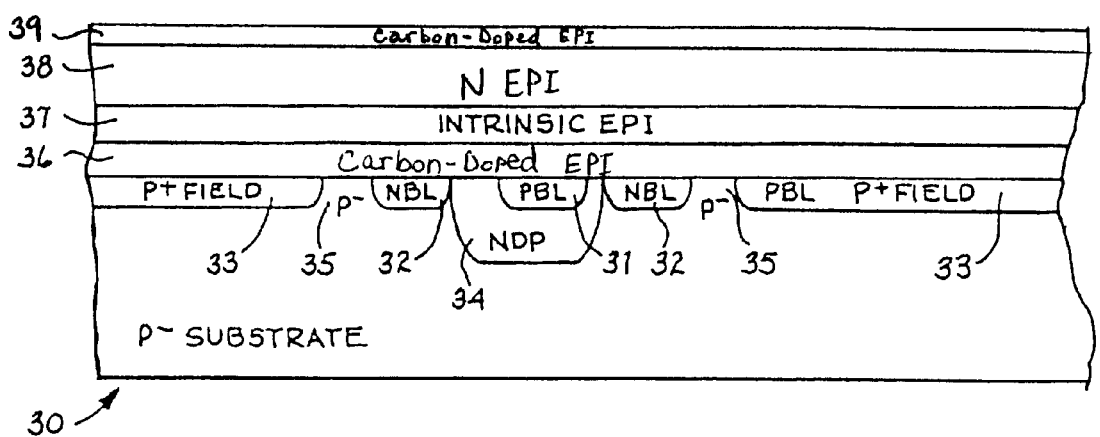
FIG. 7 is a partial section view of a CB-CMOS device including two carbon-doped epitaxial layers in accordance with an embodiment of the invention.

As is shown by the partial section view of a CB-CMOS device shown in FIG. 7, in some cases, if desired, an additional, final layer 39 of epitaxial silicon may be grown in the presence of carbon gas. Similar to the deposition of the first carbon doped epitaxial layer 36, this final layer 39 may be deposited at a temperature of about 1080° C. to a thickness of between 200 Å and 2000 Å. Also like the prior deposition step, this step should be followed by a high temperature gas purge at approximately 1080° C. Deposition of a final carbon doped epitaxial layer 39 allows for the reduction of dopant diffusivities within the region where the base and emitter diffusions form the body of the transistor. The reduced diffusivities in this region would allow for better matching of the emitter/base junction depth of the NPN and PNP high-speed bipolar transistors.

As explained with reference to the process represented in FIG. 1, the thicknesses of the various epitaxial layers and the specific temperatures at which the various steps are performed may vary within conventional ranges for the desired application. Because the carbon-doped epitaxial layer is widely applicable in a variety of epitaxial layer fabrication processes, the process may be applied through numerous combinations of temperatures and deposition thicknesses.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A method of making an epitaxial layer on a p type silicon substrate having in a major surface thereof a P+ field layer region in a substantial portion of the major surface, comprising:
    (a) loading the p type substrate in a reactor and providing a carrier gas therein;
    (b) performing a low temperature bake cycle on the p type substrate;
    (c) performing a high temperature bake cycle on the p type substrate;
    (d) depositing a carbon-doped epitaxial cap layer on the p type substrate;
    (e) performing a high temperature gas purge cycle; and
    (f) depositing an $N^-$ epitaxial layer having a thickness greater than the thickness of the carbon-doped epitaxial cap layer.

2. The method of claim 1 wherein step (b) comprises performing the low temperature bake cycle at a temperature of approximately 850° C.

3. The method of claim 1, further comprising the step of ramping the temperature of the p type substrate up to approximately 1050° C.

4. The method of claim 1 wherein step (c) comprises performing the high temperature bake cycle at a temperature of approximately 1050° C.

5. The method of claim 1 wherein step (d) comprises depositing the carbon-doped epitaxial cap layer at a temperature of approximately 1080° C.

6. The method of claim 1 wherein step (e) comprises performing the high temperature gas purge cycle at a temperature of approximately 1080° C.

7. The method of claim 1, further comprising depositing an intrinsic epitaxial cap layer on the carbon-doped epitaxial cap layer.

8. The method of claim 1, wherein the $N^-$ epitaxial layer is deposited to a thickness ranging between approximately 0.3 microns and approximately 5 microns.

9. The method of claim 3, further comprising heating the substrate while providing $N^+$ dopant gas in the carrier gas.

10. The method of claim 4, further comprising heating the p type substrate in the presence of $N^+$ dopant gas.

11. The method of claim 5, wherein the carbon-doped epitaxial cap layer is deposited to a thickness ranging between approximately 200 Å and approximately 2000 Å.

12. The method of claim 6, wherein the intrinsic epitaxial cap layer is deposited at a temperature of 1080° C.

13. The method of claim 7, wherein the intrinsic epitaxial cap layer is deposited to a thickness of approximately 0.3 microns.

14. The method of claim 8, wherein the $N^-$ epitaxial layer is deposited to a thickness of approximately 0.9 microns.

15. A method of making an epitaxial layer on a silicon substrate having in a major surface thereof a P+ field layer region in a substantial portion of the major surface, comprising:
    (a) loading the substrate in a reactor and providing a carrier gas therein;
    (b) performing a low temperature bake cycle on the substrate;
    (c) performing a high temperature bake cycle on the substrate;
    (d) depositing a carbon-doped epitaxial cap layer on the substrate;
    (e) performing a high temperature gas purge cycle; and
    (f) depositing an $N^-$ epitaxial layer having a thickness greater than the thickness of the carbon-doped epitaxial cap layer; and
    (g) depositing a carbon-doped epitaxial layer on the $N^-$ epitaxial layer.

16. A method of making an epitaxial layer on a p-type substrate having in a major surface thereof a P+ field layer region in a substantial portion of the major surface, comprising:
    (a) loading the p-type substrate in a reactor and providing a carrier gas therein;
    (b) performing a high temperature bake cycle on the p-type substrate;
    (c) depositing a carbon-doped epitaxial cap layer on the p-type substrate;
    (d) performing a high temperature gas purge cycle; and
    (e) depositing an $N^-$ epitaxial layer having a thickness substantially greater than the thickness of the carbon-doped epitaxial cap layer on the p-type substrate.

17. A method of making an epitaxial layer on a substrate having in a major surface thereof a P+ field layer region in a substantial portion of the major surface, comprising:
    (a) loading the substrate in a reactor and providing a carrier gas therein;
    (b) performing a high temperature bake cycle on the substrate;
    (c) depositing a carbon-doped epitaxial cap layer on the substrate;
    (d) performing a high temperature gas purge cycle; and
    (e) depositing an $N^-$ epitaxial layer having a thickness substantially greater than the thickness of the carbon-doped epitaxial cap layer on the substrate; and
    depositing a carbon-doped epitaxial layer on the $N^-$ epitaxial layer.

18. A method of suppressing boron diffusion from a P+ buried layer to an $N^-$ epitaxial layer in a p-type CB-CMOS silicon substrate, the method comprising depositing a carbon-doped epitaxial layer between the p-type silicon substrate and the $N^-$ epitaxial layer.

19. The method of claim 18, further comprising depositing an additional intrinsic epitaxial layer between the carbon-doped epitaxial layer and the $N^-$ epitaxial layer.

20. A method of suppressing boron diffusion from a P+ buried layer to an $N^-$ epitaxial layer in a CB-CMOS silicon substrate, the method comprising depositing a carbon-doped epitaxial layer between the silicon substrate and the $N^-$ epitaxial layer; and
    depositing a carbon-doped epitaxial layer over the $N^-$ epitaxial layer.

* * * * *